United States Patent
Mok et al.

(10) Patent No.: US 8,058,558 B2
(45) Date of Patent: Nov. 15, 2011

(54) PRINTED CIRCUIT BOARD AND MANUFACTURING METHOD THEREOF

(75) Inventors: Jee-Soo Mok, Yongin-si (KR); Dong-Jin Park, Suwon-si (KR); Jun-Heyoung Park, Suwon-si (KR); Ki-Hwan Kim, Boryeong-si (KR); Sung-Young Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1036 days.

(21) Appl. No.: 11/984,115

(22) Filed: Nov. 13, 2007

(65) Prior Publication Data

US 2008/0115961 A1    May 22, 2008

(30) Foreign Application Priority Data

Nov. 21, 2006 (KR) .................. 10-2006-0115393

(51) Int. Cl.
*H05K 1/00* (2006.01)
*H05K 7/06* (2006.01)

(52) U.S. Cl. ..................... 174/250; 361/748; 29/846

(58) Field of Classification Search .............. 174/250, 174/265, 257–259, 261–262; 361/748, 760–761; 29/825

See application file for complete search history.

(56) References Cited

U.S. PATENT DOCUMENTS

| 7,045,198 | B2 * | 5/2006 | Nakagiri et al. | 428/209 |
| 7,312,400 | B2 * | 12/2007 | Ito et al. | 174/250 |
| 7,320,173 | B2 * | 1/2008 | Lee et al. | 29/846 |
| 2008/0053688 | A1 * | 3/2008 | Park et al. | 174/258 |
| 2008/0264676 | A1 * | 10/2008 | Okabe et al. | 174/250 |

FOREIGN PATENT DOCUMENTS

| JP | 10-93242 | 4/1998 |
| JP | 10-303561 | 11/1998 |
| JP | 2005-167094 | 6/2005 |
| JP | 2006-147748 | 6/2006 |
| KR | 2005-0063689 | 6/2005 |

OTHER PUBLICATIONS

Japanese Office Action issued Sep. 14, 2010 in corresponding Japanese Patent Application 2007-274375.
Japanese Office Action issued Dec. 11, 2009 in corresponding Japanese Patent Application 2007-209405.

* cited by examiner

*Primary Examiner* — Angel R Estrada
*Assistant Examiner* — Dimary Lopez

(57) ABSTRACT

A printed circuit board and a manufacturing method thereof are disclosed. Using a method of manufacturing a printed circuit board which includes forming a circuit pattern, which includes lands, on a first board; forming a paste bump on the land of the first board; and stacking an insulation on a surface of the first board such that the paste bump penetrates the insulation, where the paste bump is formed to cover the land of the first board, the areas of the lands can be reduced to manufacture a printed circuit board of high density, and the contact reliability can be increased due to the increase in contact area between the lands and paste bumps to improve the performance of the high-density printed circuit-board.

5 Claims, 13 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2006-0115393 filed with the Korean Intellectual Property Office on Nov. 21, 2006, the disclosure of which is incorporated herein by reference in its entirety.

BACKGROUND

1. Technical Field

The present invention relates to a printed circuit board and a method of manufacturing a printed circuit board.

2. Description of the Related Art

The conventional multi-layer printed circuit board is manufactured by forming an inner layer circuit on the surface of a core substrate, such as of a copper clad laminate (CCL), by applying an additive process or subtractive process, and forming outer layer circuits by a method similar to that for the inner layer circuit while sequentially stacking insulation layers and metal layers.

With advances in electronic components, there is a growing demand for technology that can improve the performance of the HDI (high density interconnect) board, which employs interlayer electrical connection of circuit patterns and fine circuit wiring for a higher density printed circuit board. That is, to improve the performance of the HDI board, there is a need for enhanced technology in interlayer electrical connection for circuit patterns 20 and technology that provides freedom in design.

In manufacturing a multi-layer printed circuit board according to related art, half-etching is performed on a core substrate, such as that of a copper clad laminate (CCL), etc., to provide a thin thickness for the copper layer, and then after stacking a dry film, windows are opened by performing exposure, development, and etching at the positions where the BVH's (blind via holes) are to be formed. Then, the BVH's are processed by laser drilling, etc., and fill plating is performed to fill the BVH's and form a plating layer on the surface of the core substrate. Next, the surface of the core substrate is half-etched to make the thickness of the plating layer thinner, and a dry film is stacked again and exposure, development, and etching are performed to form circuit patterns. These processes are repeated to result in the manufacture of a multi-layer printed circuit board.

In other words, in manufacturing a multi-layer printed circuit board according to related art, either a copper clad laminate is used that has a thin copper layer of about 5 µm, or the copper layer of the copper clad laminate, which is the core substrate, is made thin by performing half-etching, and then the windows are opened, the BVH's are processed with laser, and half-etching is performed several times on the copper layer that has been made thicker by the fill plating, after which high-density inner layer circuits are formed, and these procedures are repeated to sequentially build up a multi-layer printed circuit board.

However, the conventional manufacturing process for a multi-layer printed circuit board, such as that described above, entails complicated processes and high manufacturing costs, due to the half-etching processes for decreasing the thickness of the copper layer or plating layer and plating processes for filling the BVH's. Also, forming the circuit patterns by repeatedly plating and etching imposes a limit to implementing high-density circuit patterns, and forming the circuit patterns by a series of stacking layers leads to long processing times.

SUMMARY

An aspect of the invention is to provide a printed circuit board and a method of manufacturing a printed circuit board, with which circuit patterns and lands for forming paste bumps can be formed in a minute scale to form circuit patterns of high density, and in which the paste bumps can be made to cover the lands to increase the contact area between a paste bump and a land and thus increase contact reliability.

One aspect of the invention provides a method of manufacturing a printed circuit board which includes forming a circuit pattern, which includes lands, on a first board; forming a paste bump on the land of the first board; and stacking an insulation on a surface of the first board such that the paste bump penetrates the insulation, where the paste bump is formed to cover the land of the first board.

After stacking the insulation, an operation may further be included of stacking a second board, on which there is formed a circuit pattern including a land, on a surface of the first board, such that the paste bump penetrating the insulation may cover the land of the second board.

In the case that the first board is formed by stacking a metal layer on an insulation layer, forming the circuit pattern may include: stacking a photosensitive film layer on the metal layer of the first board, selectively exposing and developing the photosensitive film layer in correspondence to the circuit pattern including the land, etching the metal layer in a region where the photosensitive film layer is removed, and -removing the photosensitive film layer remaining on the first board. Also, the exposing and developing operation may include: removing a portion of the photosensitive film layer by selectively exposing and developing, such that a circuit pattern comprising a land is formed on one surface of the first board and a window for processing a BVH (blind via hole) is formed on the other surface of the first board.

In the case that a circuit pattern including lands is formed on one surface of the first board, and a window for processing a BVH (blind via hole) is formed on the other surface of the first board, the method may further include, after stacking the second board: forming BVH's in the window portions of the first board and the second board, filling the BVH's with a conductive material, and forming circuit patterns on the other surfaces of the first board and the second board.

Another aspect of the invention provides a printed circuit board that includes: a first board, on which a circuit pattern that includes lands is formed; a paste bump formed on the land; and an insulation penetrated by the paste bump and stacked on the first board, where one side of the paste bump covers the land.

A second board may also be included, which is stacked on the insulation of the first board, and on which a circuit pattern including lands is formed, where the other side of the paste bump may cover the land of the second board.

Additional aspects and advantages of the invention will be set forth in part in the description which follows, and in part will be obvious from the description, or may be learned by practice of the invention.

DETAILED DESCRIPTION

Embodiments of the invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
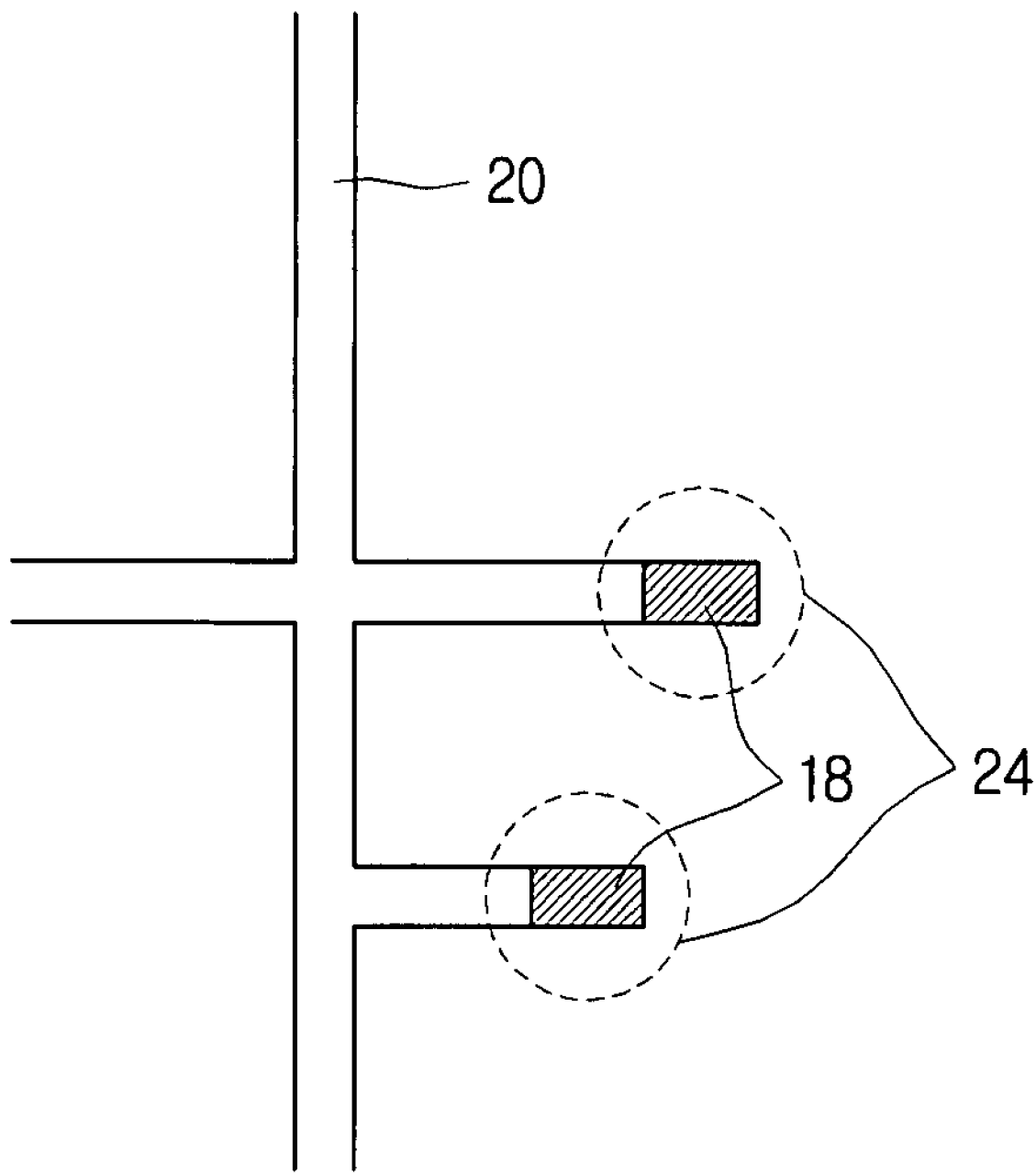
FIG. 1 is a plan view illustrating paste bumps formed on the lands of a printed circuit board according to an embodiment of the invention.
Figure 2:
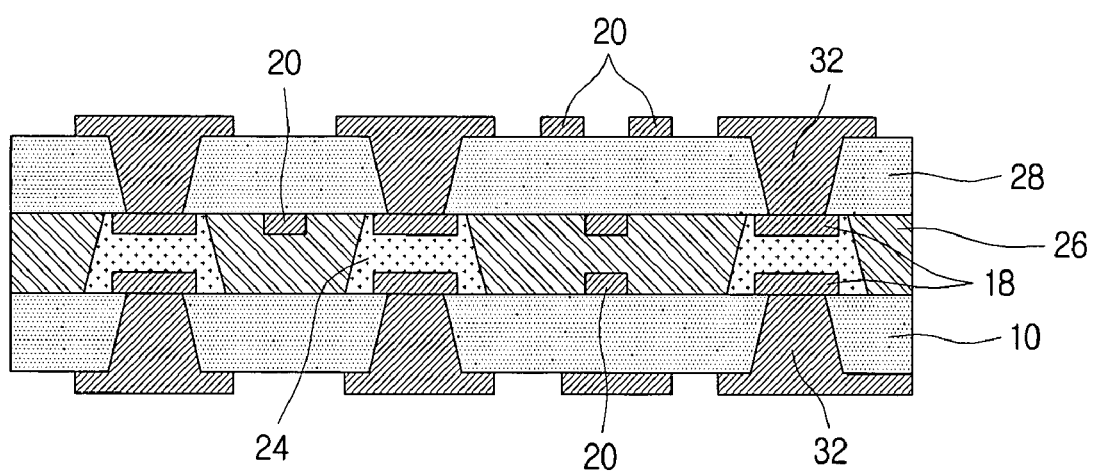
FIG. 2 is a cross-sectional view illustrating a printed circuit board according to an embodiment of the invention.
Figure 3:
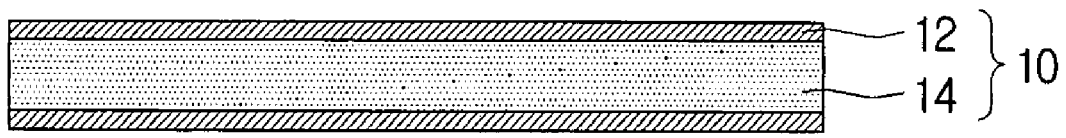
FIG. 3, FIG. 4, FIG. 5, FIG. 6 and FIG. 7 represent a flow diagram illustrating a process of manufacturing a paste bump board according to an embodiment of the invention.
Figure 4:
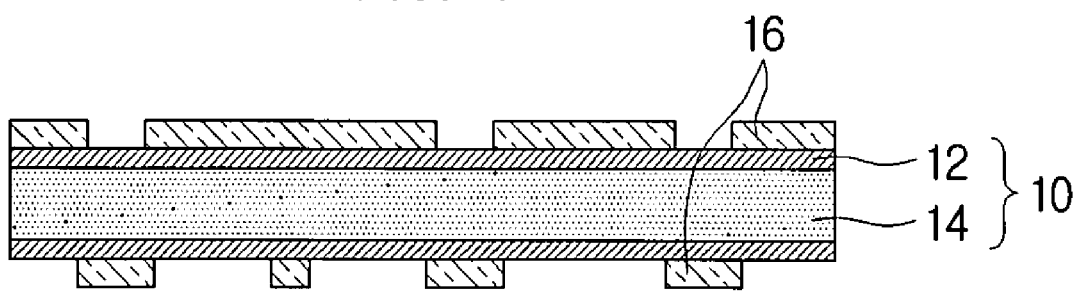
Figure 5:
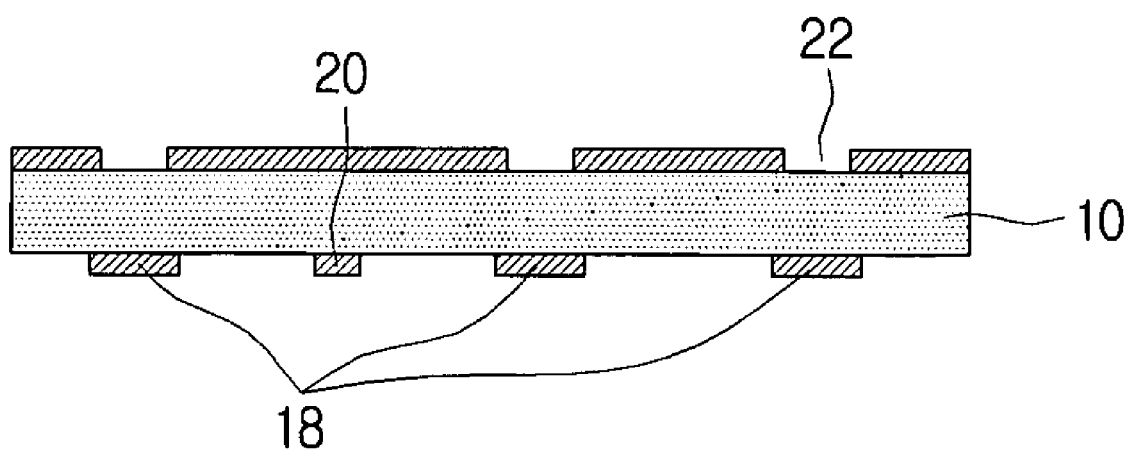
Figure 6:
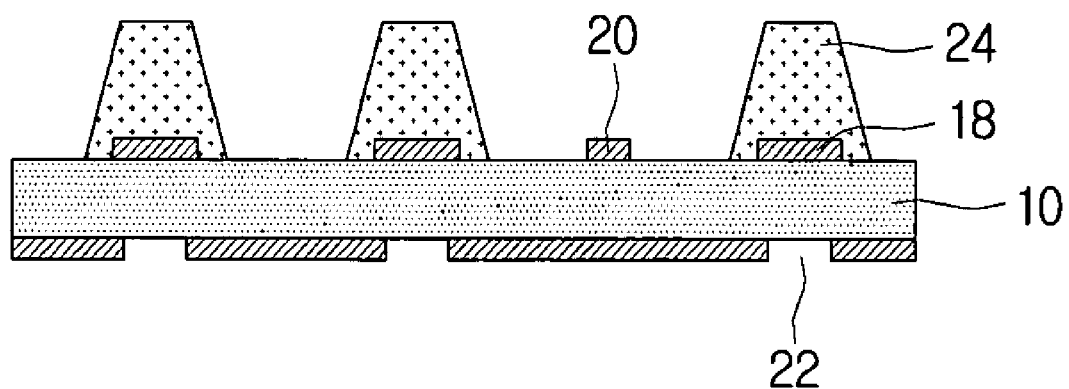
Figure 7:
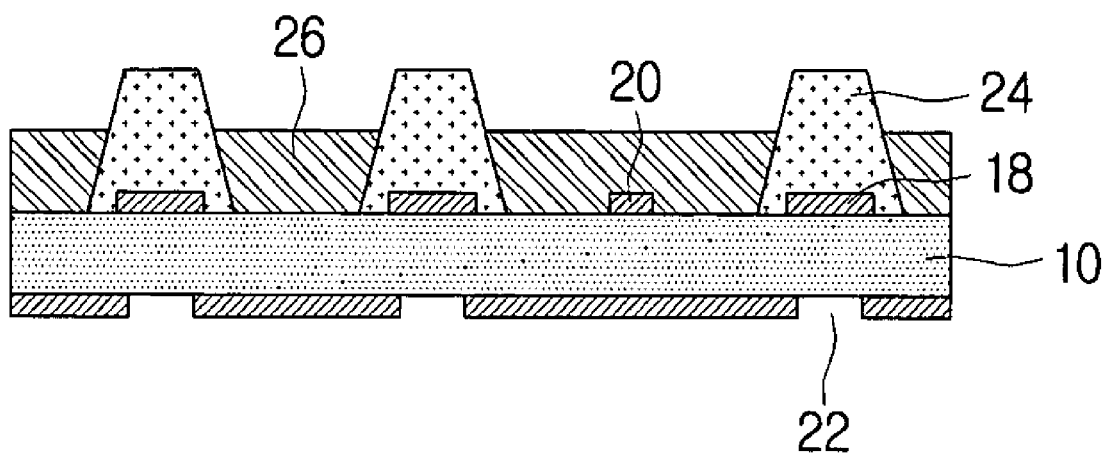
Figure 8:
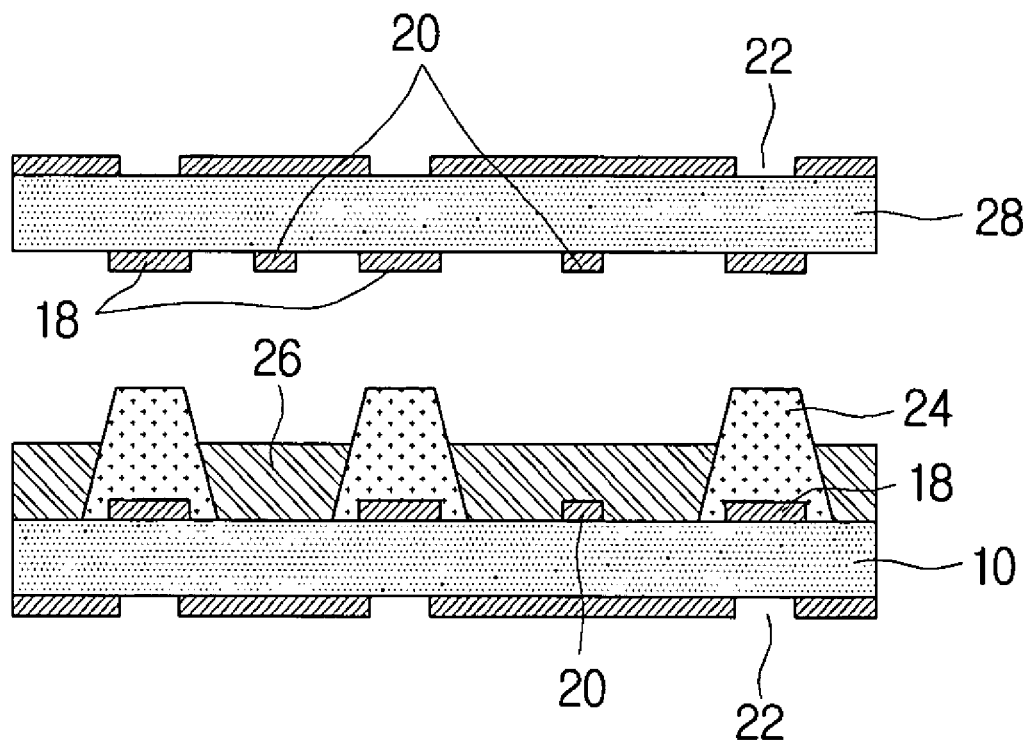
FIG. 8, FIG. 9, FIG. 10, FIG. 11 and FIG. 12 represent a flow diagram illustrating a method of manufacturing a printed circuit board according to an embodiment of the invention.
Figure 9:
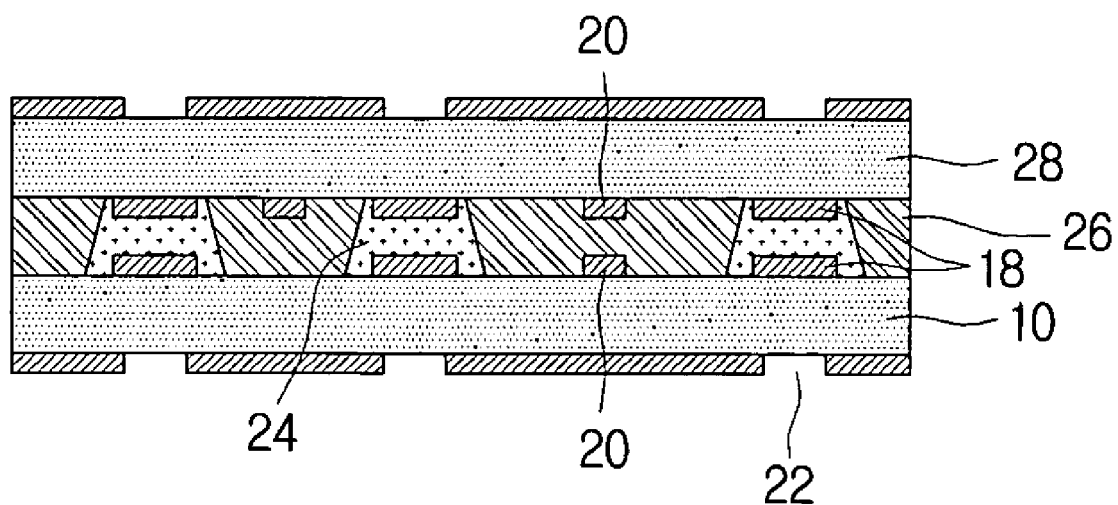
Figure 10:
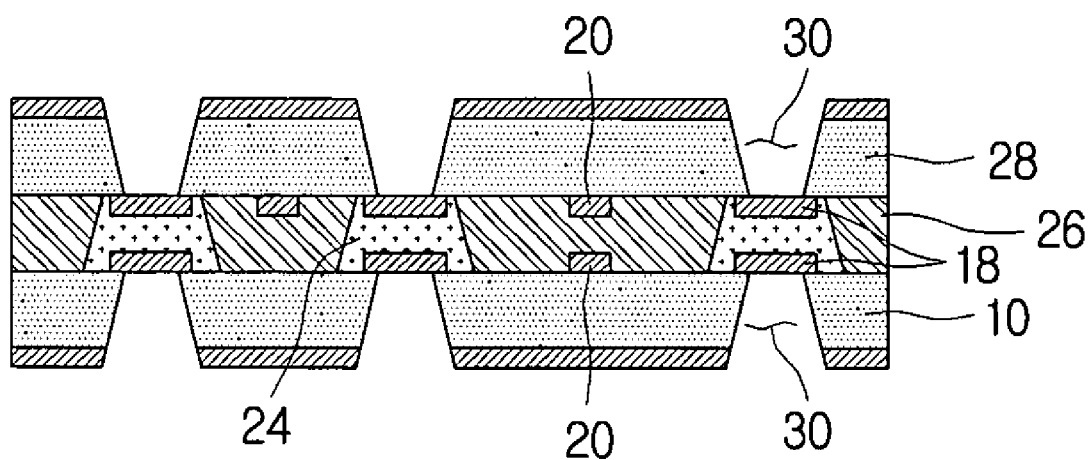
Figure 11:
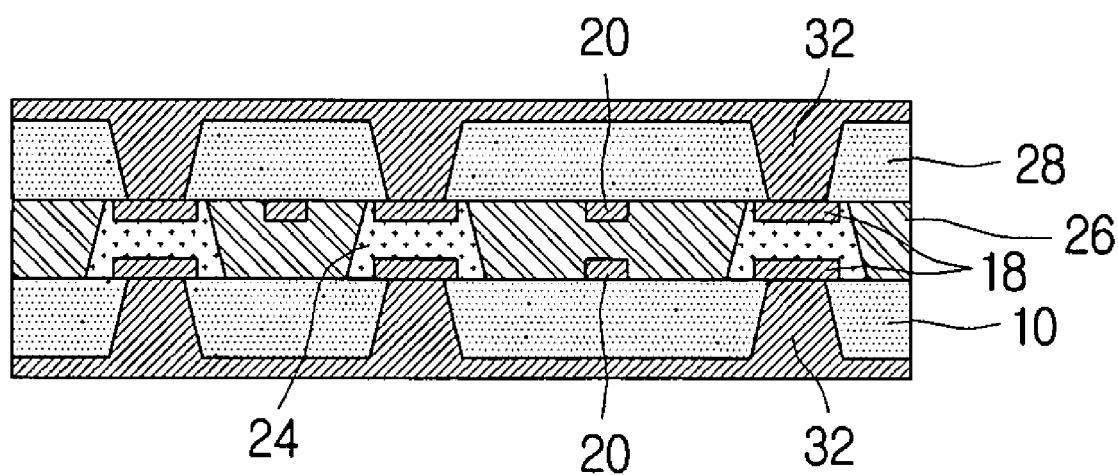
Figure 12:
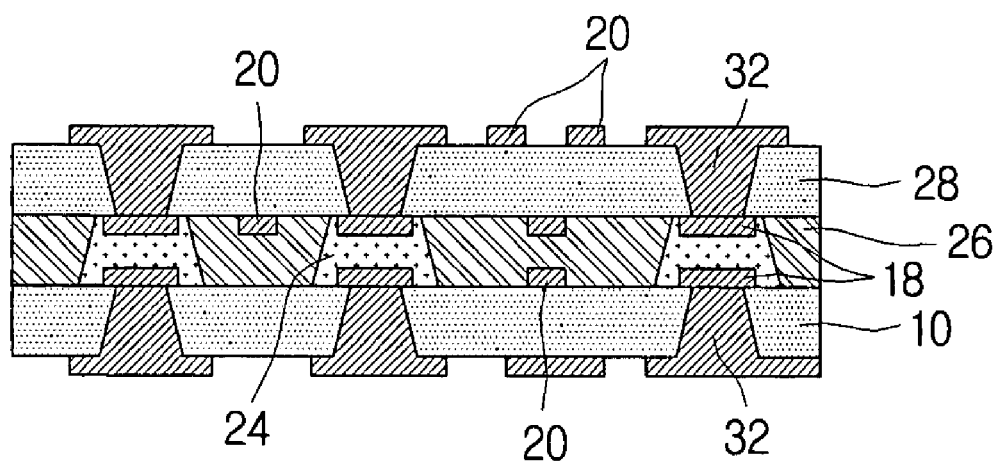

FIG. 1 is a plan view illustrating paste bumps formed on the lands of a printed circuit board according to an embodiment of the invention, and FIG. 2 is a cross-sectional view illustrating a printed circuit board according to an embodiment of the invention. In FIG. 1 and FIG. 2 are illustrated a first board 10, lands 18, circuit patterns 20, paste bumps 24, a second board 28, an insulation 26, and conductive paste 32.

A printed circuit board based on this embodiment may be composed of a first board 10, on which a circuit pattern 20 that includes lands 18 is formed, paste bumps 24 formed to cover the lands 18, and an insulation 26 penetrated by the paste bumps 24 and stacked on the first board 10. Here, a second board 28 may additionally be included, on which a circuit pattern 20 that includes lands 18 is formed, and which is stacked on the insulation 26. In this case, the other sides of the paste bumps 24 may cover the lands 18 of the second board 28.

Here, a land 18 may have a conductive paste bump 24 formed thereon for electrical connection between circuit patterns 20 formed on the board, and may be formed together with the circuit pattern 20.

By making the land 18 smaller than the region where the paste bump 24 is formed, so that the paste bump 24 formed on the land 18 is made to cover the entire land 18, the circuit pattern 20 that includes the land 18 may be formed to a minute size, whereby a circuit pattern 20 of high density may be implemented. Also, as the land 18 may be covered by the paste bump 24, the contact area may be increased between the land 18 and paste bump 24, to guarantee contact reliability.

The circuit patterns 20 on either side of the first board 10 and second board 28 may be electrically connected by BVH's (blind via holes) filled in with conductive paste 32, while the electrical connection between the first board 10 and second board 28 may obtained by way of paste bumps 24.

FIG. 3, FIG. 4, FIG. 5, FIG. 6 and FIG. 7 represent a flow diagram illustrating a process of manufacturing a paste bump board according to an embodiment of the invention. In FIG. 3 to FIG. 7 are illustrated first board 10, metal layers 12, insulation layer 14, etching resist 16, lands 18, circuit patterns 20, windows 22, paste bumps 24, and an insulation 26.

In order to simplify the complicated processes of the related art and manufacture a multi-layer printed circuit board quickly and inexpensively by collective stacking, the so-called "B2it (buried bump interconnection technology)" has been commercialized, in which paste bump boards are prefabricated, by printing paste on copper foils to form bumps and stacking insulation onto the copper foils, to allow a simple and easy stacking process.

FIG. 3, FIG. 4, FIG. 5, FIG. 6 and FIG. 7 represent a flow diagram illustrating a process of manufacturing a paste bump board according to an embodiment of the invention, in which a circuit pattern 20 including lands 18 is formed on the first board 10, paste bumps 24 are formed on the lands 18, and then an insulation 26 is stacked to manufacture a paste bump board. That is, the procedures used may involve forming a circuit pattern 20 including lands 18 on the first board 10, printing and curing the paste bumps 24 such that the paste bumps 24 entirely cover the lands 18 formed on the first board 10, and stacking the insulation 26 on a surface of the first board 10 such that the paste bumps 24 penetrate the insulation 26.

The method of forming the circuit pattern 20 including lands 18 on a surface of the first board 10 may include forming the circuit pattern 20 including lands 18 by applying an additive process, a subtractive process, or a method of coating conductive ink, etc., on the surface of the insulation layer 14. Looking, for example, at a method of forming a circuit pattern 20 including lands 18 using a first board 10 having metal layers 14 stacked on either side of an insulation layer 14, a photosensitive film layer may be stacked on the first board 10, the photosensitive film layer may be exposed and developed in correspondence with the circuit pattern 20 including lands 18 to remove portions of the photosensitive film layer, the metal layers in the regions where the photosensitive film layer is removed may be etched, and the photosensitive film layer remaining on the first board 10 may be removed, to form the circuit pattern 20 including lands 18 on the first board 10. That is, a photosensitive film layer may be stacked on the first board 10, and a photo mask may be manufactured in correspondence with the lands 18 and circuit pattern 20 and placed on the first board 10 on which the photosensitive film layer has been stacked, which is then exposed to ultraviolet rays. After the photosensitive film layer stacked on the first board 10 has been exposed, it may be developed in a developing liquid. This causes the uncured portions of the photosensitive film layer, corresponding to the circuit pattern 20 including lands 18, that have not been exposed because of the photo mask, to be removed, while causing the portions of the photosensitive film layer cured by the exposure to remain and become etching resist 16. Afterwards, an etching process may be performed to etch the portions outside the etching resist 16, and the photosensitive film layer remaining on the first board 10 may be removed, whereby the desired circuit pattern 20 including lands 18 may be formed on the first board 10. In this case, a copper clad laminate (CCL) may be used for the first board 10, which has copper layers stacked on either side of an insulation layer.

On the other surface of the first board 10, windows 22 may be formed for processing BVH's (blind via holes) 30. The window portions 22 may also be formed by performing etching after selectively forming etching resist 16, as described above. The windows 22 for processing BVH's 30 are for processing BVH's 30 that electrically connect the circuit pattern 20 formed on one surface of the first board 10 with the circuit pattern 20 to be formed on the other surface of the first board 10.

When the circuit pattern that includes lands 18 is formed on the first board 10, paste bumps 24 may be formed on the lands 18 of the first board 10. The paste bumps 24 may be for interlayer electrical connection between the first board 10 and the second board 28 described later. The paste bumps 24 may be formed by printing conductive paste on the lands 18 of the first board 10, where the paste bumps 24 may be printed to cover the lands 18 entirely and then cured. By thus having the paste bumps 24 entirely cover the lands 18, the contact area between the lands 18 and the paste bumps 24 may be increased, to improve contact reliability. A paste containing metal particles, such as silver, gold, palladium, copper, and platinum, etc., may be used for the conductive paste 32.

When the paste bumps 24 that cover the lands 18 of the first board 10 are formed, an insulation 26 is stacked on the first board 10 such that the paste bumps 24 penetrate the insulation 26. The paste bumps 24 may have a strength lower than that of the metal layers 12 forming the lands 18 and circuit pattern 20 but greater than that of the insulation 26. Thus, when the insulation 26 is stacked, the paste bumps 24 may penetrate the insulation 26 without being deformed, and also, when the second board 28 described later is stacked and pressed to electrically connect the first board 10 and second board 28, the lands 18 of the second board 28 may be unharmed by the paste bumps 24. A method of manufacturing a multi-layer printed circuit board by thus collectively stacking the paste bump board and second board 28 will be described in more detail with reference to FIG. 8, FIG. 9, FIG. 10, FIG. 11 and FIG. 12.

FIG. 8, FIG. 9, FIG. 10, FIG. 11 and FIG. 12 represent a flow diagram illustrating a method of manufacturing a printed circuit board according to an embodiment of the invention. In FIG. 8 to FIG. 12 are illustrated a first board 10, lands 18, circuit patterns 20, windows 22, paste bumps 24, an insulation 26, a second board 28, BVH's 30, and conductive paste 32.

This embodiment relates to a method of manufacturing a multi-layer printed circuit board by manufacturing a paste bump board as described above, and afterwards stacking a second board 28, having a circuit pattern 20 including lands 18 formed thereon, on the paste bump board.

Similar to the first board 10, a circuit pattern 20 may be formed on one surface of the second board 28 that includes lands 18 that are coupled with the paste bumps 24 formed on the first board 10. A paste bump 24 formed on one surface of the first board 10 may have one side coupled to a land 18 of the first board 10 and the other side coupled to a land 18 of the second board 28, to electrically connect the circuit patterns 20 formed on the first board 10 and second board 28. Therefore, the lands 18 on the first board 10 and second board 28 may be formed in corresponding positions such that they may be put into contact by the paste bumps 24. Here, the one side and the other side of a paste bump 24 may be such that cover the lands 18 of the first board 10 and second board 28, to increase the contact area between the lands 18 and the paste bump 24 and thus ensure contact reliability.

The method of forming the circuit pattern 20 including lands 18 on one surface of the second board 28 may employ the same method as that for forming the circuit pattern 20 including lands 18 on the first board 10 described above, and thus will not be described again.

On the other surface of the second board 28 may be formed windows 22 for processing BVH's 30. The windows 22 for processing BVH's 30 may be to process BVH's 30 for electrically connecting the circuit pattern 20 formed on one surface of the second board 28 with the circuit pattern 20 formed on the other surface of the second board 28.

By aligning the first board 10 and second board 28, such that the ends of the paste bumps 24 that have penetrated the insulation 26 of the first board 10 are in correspondence with the lands 18 of the second board 28, and pressing the first board 10 and second board 28, the ends of the paste bumps 24 may be pressed by the lands 18 of the second board 28, whereby the first board 10 and second board 28 may be coupled and stacked.

If the windows 22 for processing BVH's 30 have been formed on the other surface of each of the first board 10 and second board 28 before stacking the first board 10 and second board 28, the BVH's 30 may be processed, after the stacking, using a laser drill, etc., and may be filled in with a conductive material. Then, a circuit pattern 20 may be formed on the other surface of each of the first board 10 and second board 28.

A method apparent to those with ordinary skill in the art may be used for filling in conductive material, such as electroplating and/or electroless plating, filling with conductive paste, and filling with conductive ink by inkjet printing, etc.

The method of forming circuit patterns 20 on the other surfaces of the first board 10 and second board 28 may employ a conventional build-up process.

If, however, the windows 22 for processing BVH's 30 have not been formed on the other surface of each of the first board 10 and second board 28 before stacking the first board 10 and second board 28, it may also be possible to process the BVH's 30, fill with a conductive material, and form the circuit patterns 20 on the outer layers, after stacking the first board and second board.

Figure 13:
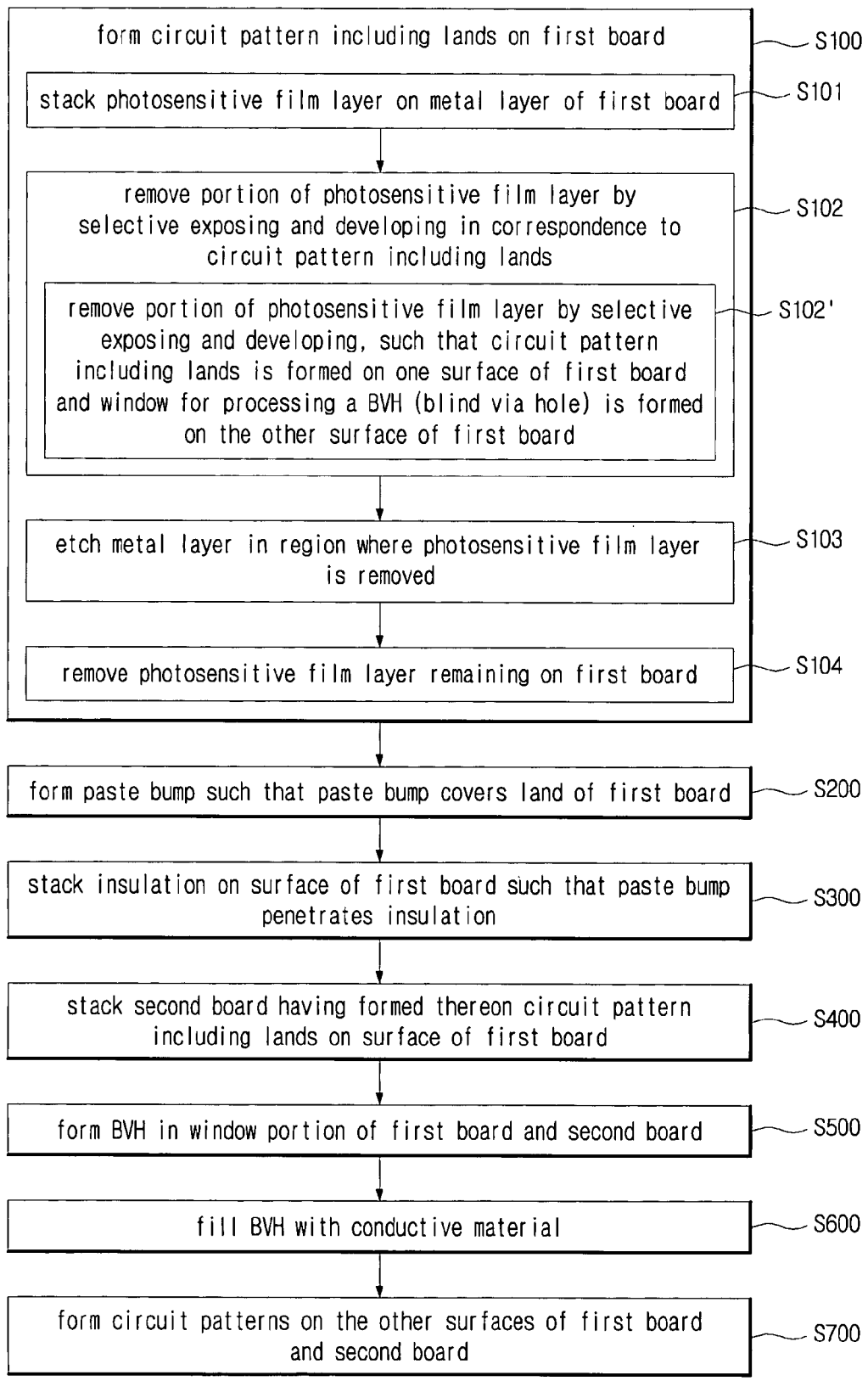
FIG. 13 is a flowchart illustrating a method of manufacturing a printed circuit board according to an embodiment of the invention.

FIG. 13 is a flowchart illustrating a method of manufacturing a printed circuit board according to an embodiment of the invention. Referring to FIG. 13, in order to first manufacture a paste bump board, a circuit pattern that includes lands may be formed on the first board, paste bumps may be printed and cured such that they entirely cover the lands formed on the first board, and then an insulation may be stacked on one surface of the first board such that the paste bumps penetrate the insulation.

The method of forming a circuit pattern including lands on one surface of the first board may include forming the circuit pattern that includes lands by applying an additive process, a subtractive process, or a method of coating conductive ink, etc., on the surface of the insulation layer (S100). Looking, for example, at a method of forming the circuit pattern including lands using a first board having metal layers stacked on either side of an insulation layer, a photosensitive film layer may be stacked on the first board (S101), the photosensitive film layer may be exposed and developed in correspondence with the circuit pattern including lands to remove portions of the photosensitive film layer (S102), the metal layers in the regions where the photosensitive film layer is removed may be etched (S103), and the photosensitive film layer remaining on the first board may be removed (S104), to form the circuit pattern including lands on the first board.

On the other surface of the first board, windows for processing BVH's (blind via holes) may be formed. The window portions may also be formed by performing etching after selectively forming etching resist (S102'), as described above.

When the circuit pattern including lands is formed on the first board, paste bumps may be formed on the lands of the first board. The paste bumps may be for interlayer electrical connection between the first board and second board. The paste bumps may be formed by printing conductive paste on the lands of the first board, where the paste bumps may be printed and cured such that they entirely cover the lands. By thus having the paste bumps entirely cover the lands, the contact area between the lands and the paste bumps may be increased, to improve contact reliability. A paste containing metal particles, such as silver, gold, palladium, copper, and platinum, etc., may be used for the conductive paste (S200).

When the paste bumps that cover the lands of the first board are formed, an insulation may be stacked on the first board such that the paste bumps penetrate the insulation. The paste bumps may have a strength lower than that of the metal layers forming the lands and circuit pattern but greater than that of the insulation. Thus, when the insulation is stacked, the paste bumps may penetrate the insulation without being deformed, and also, when the second board is stacked and pressed to electrically connect the first board and second board, the lands of the second board may be unharmed by the paste bumps (S300)

After manufacturing the paste bump board as set forth above, a second board, on which a circuit pattern that includes lands is formed, may be stacked on the paste bump board to manufacture a multi-layer printed circuit board. Here, a circuit pattern may be formed on a surface of the second board, just as for the first board, that includes lands which are coupled with the paste bumps formed on the first board.

The paste bumps formed on one surface of the first board may each have one side coupled to a land of the first board and the other side coupled to a land of the second board, to electrically connect the circuit patterns formed on the first board and second board. Therefore, the lands on the first board and second board may be formed in corresponding positions such that they may be put into contact by the paste bumps. Here, the one side and the other side of a paste bump may be such that cover the lands of the first board and second board, to increase the contact area between the lands and the paste bump and thus ensure contact reliability.

Windows for processing BVH's may be formed on the other surface of the second board. The windows for processing BVH's may be for processing BVH's that electrically connect the circuit pattern formed on one surface of the second board with the circuit pattern formed on the other surface of the second board.

By aligning the first board and second board such that the ends of the paste bumps that have penetrated the insulation of the first board are in correspondence with the lands of the second board, and pressing the first board and second board, the ends of the paste bumps may be pressed by the lands of the second board, whereby the first board and second board may be coupled and stacked (S400).

If the windows for processing BVH's have been formed, before stacking the first board and second board, on the other surface of each of the first board and second board, the BVH's may be processed (S500) after the stacking using a laser drill, etc., and may be filled in with a conductive material (S600), after which a circuit pattern may be formed on the other surface of each of the first board and second board (S700).

According to certain embodiments of the invention as set forth above, the areas of the lands can be reduced to manufacture a printed circuit board of high density, and the contact reliability can be increased due to the increase in contact area between the lands and paste bumps to improve the performance of the high-density printed circuit board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board, the method comprising:
   forming a circuit pattern on one surface of a first board, the circuit pattern comprising a land;
   forming a paste bump on the land of the first board such that the paste bump covers an upper surface and lateral sides of the land in a buried form;
   stacking an insulation on the one surface of the first board such that the paste bump penetrates the insulation; and
   stacking a second board on the one surface of the first board, the second board having a circuit pattern formed thereon, the circuit pattern comprising a land,
   wherein the paste bump penetrating the insulation covers a side toward the paste bump and lateral sides of the land of the second board in a buried form.

2. The method of claim 1, wherein the first board is formed by stacking a metal layer on an insulation layer, and
   forming the circuit pattern comprises:
   stacking a photosensitive film layer on the metal layer of the first board;
   selectively exposing and developing the photosensitive film layer in correspondence to the circuit pattern including the land;
   etching the metal layer in a region where the photosensitive film layer is removed; and
   removing the photosensitive film layer remaining on the first board.

3. The method of claim 2, wherein the exposing and developing comprises:
   removing a portion of the photosensitive film layer by selectively exposing and developing, such that a circuit pattern comprising a land is formed on one surface of the first board and a window for processing a blind via hole (BVH) is formed on the other surface of the first board.

4. The method of claim 1, wherein the first board has a circuit pattern comprising a land formed on one surface and has a window for processing a blind via hole (BVH) formed on the other surface,
   the second board has a circuit pattern comprising a land formed on one surface and has a window for processing a BVH formed on the other surface, and
   the method further comprises, after stacking the second board:
   forming BVH's in the window portions of the first board and the second board;
   filling the BVH's with a conductive material; and
   forming circuit patterns on the other surfaces of the first board and the second board.

5. A printed circuit board comprising:
   A first board having a circuit pattern formed thereon, the circuit pattern comprising a land;
   a paste bump formed on the first board such that one side of the paste bump covers an upper surface and lateral sides of the land in a buried form; and
   an insulation penetrated by the paste bump and stacked on the first board; and
   a second board having a circuit pattern formed thereon and being stacked on the insulation, the circuit pattern comprising a land,
   wherein another side of the paste bump covers a side toward the paste bump and lateral sides of the land of the second board in a buried form.

* * * * *

UNITED STATES PATENT AND TRADEMARK OFFICE
CERTIFICATE OF CORRECTION

| | | |
|---|---|---|
| PATENT NO. | : 8,058,558 B2 | Page 1 of 1 |
| APPLICATION NO. | : 11/984115 | |
| DATED | : November 15, 2011 | |
| INVENTOR(S) | : Mok et al. | |

It is certified that error appears in the above-identified patent and that said Letters Patent is hereby corrected as shown below:

Column 8, Line 48, in claim 5, delete "A first" and insert -- a first --, therefor.

Signed and Sealed this

Seventh Day of February, 2012

David J. Kappos
*Director of the United States Patent and Trademark Office*